(12) United States Patent
Ye

(10) Patent No.: US 12,727,332 B2
(45) Date of Patent: Sep. 1, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Sihao Ye, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 350 days.

(21) Appl. No.: 18/266,728

(22) PCT Filed: May 15, 2023

(86) PCT No.: PCT/CN2023/094148
§ 371 (c)(1),
(2) Date: Jun. 12, 2023

(87) PCT Pub. No.: WO2024/216691
PCT Pub. Date: Oct. 24, 2024

(65) Prior Publication Data

US 2024/0349539 A1 Oct. 17, 2024

(30) Foreign Application Priority Data

Apr. 17, 2023 (CN) ......................... 202310417036.9

(51) Int. Cl.
*H10K 59/122* (2023.01)
*H10K 59/80* (2023.01)

(52) U.S. Cl.
CPC ..... *H10K 59/122* (2023.02); *H10K 59/80521* (2023.02); *H10K 59/873* (2023.02)

(58) Field of Classification Search
CPC ........... H10K 59/122; H10K 59/80521; H10K 59/873
See application file for complete search history.

(56) References Cited

U.S. PATENT DOCUMENTS 10,854,844 B2 * 12/2020 Paek .................... H10K 59/873
2021/0399262 A1 * 12/2021 Woo ..................... H10K 59/873
2022/0093895 A1 * 3/2022 Zhang .................. H10K 50/844

FOREIGN PATENT DOCUMENTS

CN 109545831 A 3/2019
CN 111490073 A * 8/2020 ......... H10K 59/8794
(Continued)

OTHER PUBLICATIONS

PCT International Search Report for International Application No. PCT/CN2023/094148, mailed on Dec. 27, 2023, 7pp.
(Continued)

*Primary Examiner* — Fatima N Farokhrooz
(74) *Attorney, Agent, or Firm* — The Roy Gross Law Firm, LLC; Roy D. Gross

(57) ABSTRACT

A display panel and a display device are provided. The display panel includes a substrate, a conductive structure, a first planarization layer, a second planarization layer, a pixel definition layer, and a cathode layer. The conductive structure is located on a side of the substrate. The first planarization layer covers the conductive structure and extending from a display area to a non-display area. The cathode layer is located on a side of the pixel definition layer away from the substrate. The display panel further includes a first spacing groove located in the non-display area and penetrating through the second definition layer and the pixel definition layer. A boundary of the cathode layer falls into the first spacing groove.

20 Claims, 2 Drawing Sheets

(56) References Cited

FOREIGN PATENT DOCUMENTS

| | | | | | |
|---|---|---|---|---|---|
| CN | 111725257 | A | * | 9/2020 | ............. H10K 59/60 |
| CN | 112447818 | A | | 3/2021 | |
| CN | 113363264 | A | * | 9/2021 | ........... H01L 25/167 |
| CN | 115117280 | A | | 9/2022 | |
| JP | 2023029445 | A | * | 3/2023 | ........... G09G 3/3266 |
| KR | 20210028790 | A | | 3/2021 | |
| KR | 20210074549 | A | | 6/2021 | |
| WO | 2021097690 | A1 | | 5/2021 | |
| WO | 2023023908 | A1 | | 3/2023 | |

OTHER PUBLICATIONS

PCT Written Opinion of the International Searching Authority for International application No. PCT/ CN2023/094148, mailed on Dec. 27, 2023, 6pp.

Korean Office Action issued in corresponding Korean Patent Application No. 10-2023-7041234 dated Jun. 10, 2025, pp. 1-7, 20pp.

* cited by examiner

DISPLAY PANEL AND DISPLAY DEVICE

CROSS REFERENCE TO RELATED APPLICATIONS

This application is a continuation of International Application No. PCT/CN2023/094148, filed on May 15, 2023, which claims priority to and the benefit of Chinese Patent Application No. 202310417036.9, filed on Apr. 17, 2023. The disclosures of the aforementioned applications are incorporated herein by reference in their entireties

TECHNICAL FIELD

The present application relates to a technical field of display, and in particular to a display panel and a display device.

BACKGROUND

In a process of manufacturing an organic light-emitting diode (OLED) display panel, organic film layers in a non-display area of the display panel need to be dug out to form a barrier groove for leveling an organic encapsulation layer, and a conductive structure at a bottom of the barrier groove is exposed. Affected by a process accuracy of film forming and considering requirements of a narrow frame, a boundary of a cathode generally extends into the barrier groove, so that the cathode is easy to contact the conductive structure exposed, resulting in a risk of short circuit. In related technology, a passivation (PV) layer is disposed between the cathode and the conductive structure to block the cathode and the conductive structure, so as to reduce the risk of short circuit. However, manufacturing the PV layer needs at least one process, which is not conducive to reducing cost.

SUMMARY

A display panel and a display device are provided to solve a technical problem that a passivation (PV) layer is disposed between a cathode and a conductive structure to reduce a risk of short circuit therebetween in existing display panel and display device, resulting in increased manufacturing process, which is not conducive to reducing cost.

In order to solve the problem mentioned above, technical solutions provided by the present application are as follows:

A display panel provided by the present application, includes a display area and a non-display area located on at least one side of the display area, and further includes:

- a substrate;
- a conductive structure, located on a side of the substrate and extending from the display area to the non-display area;
- a first planarization layer, covering the conductive structure and extending from the display area to the non-display area;
- a second planarization layer, located on a side of the first planarization layer away from the substrate and located in the display area and the non-display area;
- a pixel definition layer, located on a side of the second planarization layer away from the substrate and located in the display area and the non-display area; and
- a cathode layer, located on a side of the pixel definition layer away from the substrate;
- the display panel further includes a first spacing groove located in the non-display area, the first spacing groove penetrates through the second definition layer and the pixel definition layer, and a boundary of the cathode layer falls into the first spacing groove.

According to the display panel provided by the present application, the display panel further includes a first barrier dam and a second barrier dam located in the non-display area at intervals, the second barrier dam is located on a side of the first barrier dam away from the first spacing groove, and a second spacing groove is defined between the first barrier dam and the second barrier dam;

- the first barrier dam includes the second planarization layer and the pixel definition layer, and the second barrier dam includes the pixel definition layer and does not include the second planarization layer.

According to the display panel provided by the present application, the display panel further includes an etching barrier layer located on the side of the first planarization layer away from the substrate and located in the non-display area, wherein an orthographic projection of the etching barrier layer on the substrate at least covers an orthographic projection of the first spacing groove on the substrate.

According to the display panel provided by the present application, an orthographic projection of a boundary of the etching barrier layer away from the display area on the substrate is within an orthographic projection of the second barrier dam on the substrate.

According to the display panel provided by the present application, the etching barrier layer is made of metal.

According to the display panel provided by the present application, the etching barrier layer is provided with a plurality of exhaust holes in the first spacing groove, and the first planarization layer is exposed by the plurality of exhaust holes.

According to the display panel provided by the present application, a plurality of planarization blocks corresponding to the plurality of exhaust holes are disposed in the first spacing groove and are disposed in a same layer as the second planarization layer, and an orthographic projection of each of the plurality of planarization blocks on the substrate covers an orthographic projection of a corresponding one of the plurality of exhaust holes on the substrate.

According to the display panel provided by the present application, an aperture of each of the plurality of exhaust holes ranges from 12 microns to 18 microns, and a width of each of the plurality of planarization blocks ranges from 12 microns to 18 microns.

According to the display panel provided by the present application, the cathode layer contacts the etching barrier layer in the first spacing groove.

According to the display panel provided by the present application, the display panel includes an encapsulation layer disposed on a side of the cathode layer away from the substrate, wherein the encapsulation layer includes a first inorganic encapsulation layer, an organic encapsulation layer, and a second inorganic encapsulation layer arranged and stacked in a thickness direction of the display panel and extending from the display area to the non-display area;

- the first inorganic encapsulation layer contacts the etching barrier layer in the first spacing groove.

According to the display panel provided by the present application, the conductive structure includes a first conductive layer and a second conductive layer arranged and stacked in a thickness direction of the display panel;

- wherein the display panel further includes a third planarization layer located in the display area and covering at least part of a side of the first conductive layer and part of a side of the substrate located in the display area, and the part of the second conductive layer in the display area is located on a side of the third planarization layer away from the substrate.

According to the display panel provided by the present application, when the first planarization layer, the second planarization layer, and the pixel definition layer are etched with a same etching liquid, an etching rate of the first planarization layer is less than an etching rate of the second planarization layer and an etching rate of the pixel definition layer.

A display device provided by the present application, includes the display panel mentioned above. The display panel includes a display area and a non-display area located on at least one side of the display area, and further includes:

a substrate;

a conductive structure, located on a side of the substrate and extending from the display area to the non-display area;

a first planarization layer, covering the conductive structure and extending from the display area to the non-display area;

a second planarization layer, located on a side of the first planarization layer away from the substrate and located in the display area and the non-display area;

a pixel definition layer, located on a side of the second planarization layer away from the substrate and located in the display area and the non-display area; and a cathode layer, located on a side of the pixel definition layer away from the substrate;

the display panel further includes a first spacing groove located in the non-display area, the first spacing groove penetrates through the second definition layer and the pixel definition layer, and a boundary of the cathode layer falls into the first spacing groove.

According to the display device provided by the present application, the display panel further includes a first barrier dam and a second barrier dam located in the non-display area at intervals, the second barrier dam is located on a side of the first barrier dam away from the first spacing groove, and a second spacing groove is defined between the first barrier dam and the second barrier dam;

the first barrier dam includes the second planarization layer and the pixel definition layer, and the second barrier dam includes the pixel definition layer and does not include the second planarization layer.

According to the display device provided by the present application, the display panel further includes an etching barrier layer located on the side of the first planarization layer away from the substrate and located in the non-display area, wherein an orthographic projection of the etching barrier layer on the substrate at least covers an orthographic projection of the first spacing groove on the substrate.

According to the display device provided by the present application, an orthographic projection of a boundary of the etching barrier layer away from the display area on the substrate is within an orthographic projection of the second barrier dam on the substrate.

According to the display device provided by the present application, the etching barrier layer is made of metal.

According to the display device provided by the present application, the etching barrier layer is provided with a plurality of exhaust holes in the first spacing groove, and the first planarization layer is exposed by the plurality of exhaust holes.

According to the display device provided by the present application, a plurality of planarization blocks corresponding to the plurality of exhaust holes are disposed in the first spacing groove and are disposed in a same layer as the second planarization layer, and an orthographic projection of each of the plurality of planarization blocks on the substrate covers an orthographic projection of a corresponding one of the plurality of exhaust holes on the substrate.

According to the display device provided by the present application, the conductive structure includes a first conductive layer and a second conductive layer arranged and stacked in a thickness direction of the display panel;

the display panel further includes a third planarization layer located in the display area and covering part of the first conductive layer and the substrate in the display area, and part of the second conductive layer in the display area is located on a side of the third planarization layer away from the substrate.

Beneficial effects of the present application are: the embodiments of the present application provide the display panel and the display device. A first planarization layer covering the conductive structure extends from the display area to the non-display area. When the cathode layer is manufactured, even if a cathode material falls into the first spacing groove due to a process precision, since the first planarization layer may shield the cathode material, so that short circuit may be prevented after the cathode and the conductive structure are lapped joint in the non-display area, which is beneficial to improving a yield of the display panel. Meanwhile, compared with the prior art, a passivation layer between the cathode layer and the conductive structure does not need to be manufactured, which is beneficial to saving manufacturing process and reducing cost.

BRIEF DESCRIPTION OF THE DRAWINGS

To describe the technical solutions of the embodiments of the present application more clearly, the following briefly introduces the accompanying drawings used in the description of the embodiments of the present application. The accompanying drawings described below illustrate only some exemplary embodiments of the present application, and persons skilled in the art may derive other drawings from the drawings without making creative efforts.

DESCRIPTION OF REFERENCE NUMBERS

Figure 1:
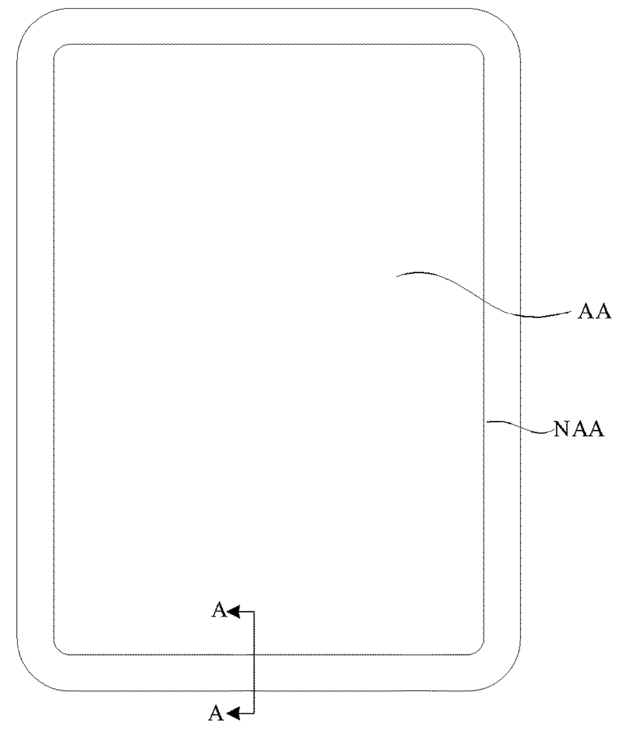
FIG. 1 is a plan structural schematic diagram of a display panel provided by an embodiment of the present application.

AA, display area; NAA, non-display area; 10, substrate; 11, conductive structure; 111, first conductive layer; 112, second conductive layer; 12, first planarization layer; 13, etching barrier layer; 131, exhaust hole; 14, second planarization layer; 141, planarization block; 15, pixel definition layer; 16, cathode layer; 17, encapsulation layer; 18, third planarization layer; 21, first spacing groove; 22, first barrier dam; 23, second barrier dam; 24, second barrier dam.

DETAILED DESCRIPTION

The technical solutions in the embodiments of the present application will be described clearly and completely hereafter with reference to the accompanying drawings. Apparently, the described embodiments are only a part of but not all embodiments of the present application. All other embodiments obtained by persons of ordinary skill in the art based on the embodiments of the present application without creative efforts shall fall within the protection scope of the present application. In addition, it should be understood that the specific embodiments described herein are only used to illustrate and explain the present application, but not to limit the present application. In this present application, unless otherwise stated, the directional words used such as “upper” and “lower” generally refer to the upper and lower parts of the device in actual use or working state, specifically the direction of the drawing in the drawings; while “inside” and “outside” refer to the outline of the device.

Specific embodiments of the present application are described in further detail below with reference to the accompanying drawings and embodiments. The following embodiments are used to illustrate the present application, but are not intended to limit the scope of the present application.

Figure 2:
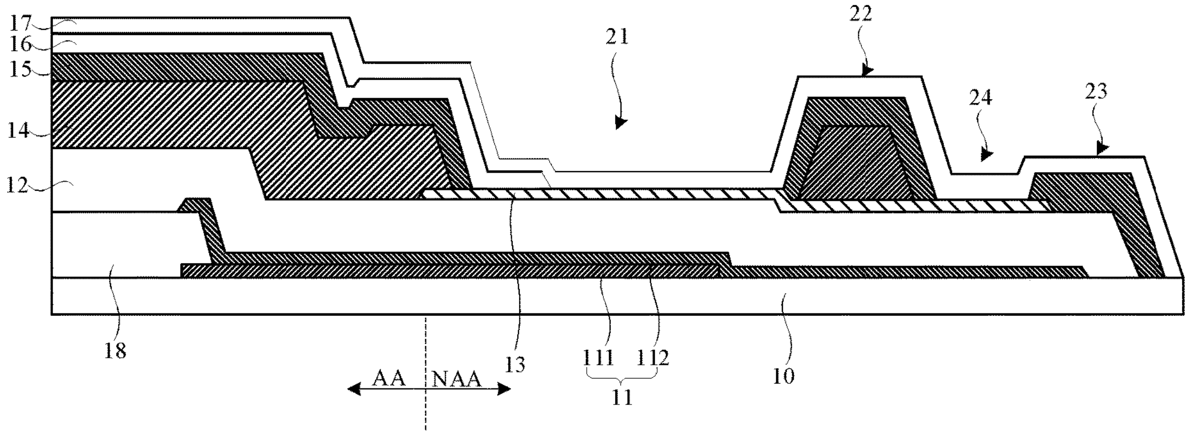
FIG. 2 is a cross-sectional structural schematic diagram of the display panel along a section line A-A in FIG. 1.

Referring to FIG. 1 and FIG. 2, the present application provides a display panel. The display panel includes a display area AA and a non-display area NAA located on at least one side of the display area AA.

The display panel further includes a substrate 10, a conductive structure 11, a first planarization layer 12, a second planarization layer 14, a pixel definition layer 15, and a cathode layer 16.

The conductive structure 11 is located on a side of the substrate 10 and extends from the display area AA to the non-display area NAA. The first planarization layer 12 covers the conductive structure 11 and extends from the display area AA to the non-display area NAA. The second planarization layer 14 is located on a side of the first planarization layer 12 away from the substrate 10 and is located in the display area AA and the non-display area NAA. The pixel definition layer 15 is located on a side of the second planarization layer 14 away from the substrate 10 and located in the display area AA and the non-display area NAA. The cathode layer 16 is located on a side of the pixel definition layer 15 away from the substrate 10.

In the embodiments of the present application, the display panel further includes a first spacing groove 21 located in the non-display area NAA. The first spacing groove 21 penetrates through the second definition layer 14 and the pixel definition layer 15. A boundary of the cathode layer 16 falls into the first spacing groove 21.

It may be understood that the first planarization layer 12 covers the conductive structure 11 extends from the display area AA to the non-display area NAA in the embodiments of the present application. When the cathode layer 16 is manufactured, because of a shadow effect, even if a cathode material falls into the first spacing groove 21 due to process accuracy, the first planarization layer 12 may block the cathode material, thereby preventing the cathode material from lapping with the conductive structure 11 located in the non-display area NAA, which results in short circuit, this is beneficial to improving a yield of the display panel. Compared with the prior art, a passivation layer which also plays a barrier role does not need to be manufactured between the cathode layer 16 and the conductive structure 11, which is beneficial to saving the manufacturing process and reducing the cost.

In the present embodiments, the non-display area NAA is located below the display area AA, that is, the non-display area NAA is a lower border of the display panel.

Specifically, a material of the substrate 10 is a flexible material, so that the substrate 10 may be bent to form a curved screen. Optionally, the material of the substrate 10 may be polyimide (PI). The conductive structure 11 may be a single-layer metal wiring structure, a double-layer metal wiring structure, or a multi-layer metal wiring structure. The conductive structure 11 may be electrically connected with a power supply signal VDD or an initialization signal Vinit.

Specifically, the first planarization layer 12 and the second planarization layer 14 are organic film layers for realizing planarization. A material of the first planarization layer 12 and a material of the second planarization layer 14 may be same or different. Optionally, both the material of the first planarization layer 12 and the material of the second planarization layer 14 may include an organic material such as acrylic, PI, or benzocyclobutene (BCB). Specifically, the pixel definition Layer 15 may be formed of organic materials such as PI, polyamide, BCB, acrylic resin, or phenolic resin.

In the embodiments of the present application, the display panel further includes an array layer (not shown in the figures) disposed on the substrate 10. The array layer includes a plurality of thin film transistors located in the display area AA. The thin film transistors include film layers such as a gate electrode, a gate insulating layer, an active layer, a source electrode, and a drain electrode. The display area AA is further provided with a light-emitting layer located in a plurality of pixel openings defined by the pixel definition layer 15 in the display area AA. The cathode layer 16 covers the pixel definition layer 15 and the light-emitting layer. The light-emitting layer includes a hole injection layer, a hole transport layer, an organic light-emitting material layer, an electron transport layer, and an electron injection layer, which is prior art and is not a key point of this present application, which will not be described in detail here.

In the embodiments of the present application, at least one conductive film layer of the conductive structure 11 is in a same layer as a film layer where the source electrode and the drain electrode are located, and the first planarization layer 12 covers the array layer. It should be noted that the passivation layer is disposed on the array layer in the prior art, and the first planarization layer 12 covers the passivation layer. In contrast, the passivation layer is canceled in the present application, which is beneficial to saving the manufacturing process and reducing the cost.

In the embodiments of the present application, continue to refer to FIG. 2, the display panel further includes a first barrier dam 22 and a second barrier dam 23 located in the non-display area NAA at intervals. The second barrier dam 23 is located on a side of the first barrier dam 22 away from the first spacing groove 21. A second spacing groove 24 is defined between the first barrier dam 22 and the second barrier dam 23. The first barrier dam 22 includes the second planarization layer 14 and the pixel definition layer 15, and the second barrier dam 23 includes the pixel definition layer 15 and does not include the second planarization layer 14.

It may be understood that the first barrier dam 22 and the second barrier dam 23 are formed by opening the first spacing groove 21 and second spacing groove 24. The first barrier dam 22 is located between the first spacing groove 21 and the second spacing groove 24. A height difference is formed between the first barrier dam 22 and the first spacing groove 21, which mainly plays a role of blocking organic encapsulation materials from overflowing. The greater the height difference formed between the first barrier dam 22 and the first spacing groove 21, the better a blocking ability of the first barrier dam 22 against the organic encapsulation materials. The first planarization layer 12 extends from the display area AA to the non-display area NAA, that is, the non-display area NAA is provided with the first planarization layer 12, and a thickness of film layers below the first spacing groove 21 increases. That is, compared with the prior art, a depth of the first spacing groove 21 may be opened in the present application decreases, and the height difference between the first barrier dam 22 and the first spacing groove 21 decreases, resulting in a deterioration of the barrier ability of the first barrier dam 22 against the organic encapsulation materials.

In view of this, in order not to affect the barrier ability of the first barrier dam 22 against the organic encapsulation materials, a stacked structure of the first barrier dam 22 also includes the second planarization layer 14 and the pixel definition layer 15 compared with the prior art. That is, the height difference formed between the first barrier dam 22 and the first spacing groove 21 in the present application is unchanged, so that the barrier ability of the first barrier dam 22 against the organic encapsulation materials is not reduced.

In addition, a height of the first barrier dam 22 and a height of the second barrier dam 23 in the prior art are same. Both of the first barrier dam 22 and the second barrier dam 23 include two film layers, which are the second planarization layer 14 and the pixel definition layer 15. Both the first barrier dam 22 and the second barrier dam 23 play the role of blocking the organic encapsulation materials. In contrast, the first barrier dam 22 and the second barrier dam 23 have different heights in the present application, and the height of the first barrier dam 22 is greater than the height of the second barrier dam 23. Specifically, the first barrier dam 22 includes at least two film layers including the second planarization layer 14 and the pixel definition layer 15, and the second barrier dam 23 does not include the second planarization layer 14. That is, the height difference between the second barrier dam 23 and the first barrier dam is the height of the second planarization layer 14, at which time the first barrier dam 22 plays the role of blocking the organic encapsulation materials.

A reason why the height of the second barrier dam 23 is reduced in this present application is that the display panel further includes a touch layer located on the side of the second planarization layer 14 away from the substrate 10. The touch layer may adopt a direct-on-cell touch (DOT) mode. The touch layer includes a plurality of touch wirings extending from the display area AA to the non-display area NAA. The plurality of touch wirings are metal wirings, which are easy to break when climbing hills, thereby affecting touch performance. Compared with the prior art, the height of the second barrier dam 23 in the embodiments of the present application is reduced, thereby preventing the touch wirings from being broken when claiming hills at the second barrier dam 23. It should be noted that the height here refers to a film thickness of the first barrier dam 22 and the second barrier dam 23 protruding from the first spacing groove 21 in a thickness direction of the display panel.

It should be noted that a number of the barrier dams in the embodiments of the present application is two, but this is only an example, and in other embodiments, the number of the barrier dams may be multiple, which is not limited in the present application.

Furthermore, in one embodiment, continue to refer to FIG. 2, the display panel further includes an etching barrier layer 13 located on the side of the first planarization layer 12 away from the substrate 10 and located in the non-display area NAA. An orthographic projection of the etching barrier layer 13 on the substrate 10 at least covers an orthographic projection of the first spacing groove 21 on the substrate 10. A reason for this arrangement is that after the first planarization layer 12 is formed, the organic film layers located above the first planarization layer 12 and located in the non-display area NAA need to be patterned. For example, the second planarization layer 14 and the pixel definition layer 15 are patterned to form the first spacing groove 21 and the second spacing groove 24. The first planarization layer 12, the second planarization layer 14, and the pixel defining layer 15 are generally made of organic materials. If there is no shielding above the first planarization layer 12, an etching liquid for etching the second planarization layer 14 and the pixel defining layer 15 easily flows to a surface of the first planarization layer 12 through the first spacing groove 21 and the second spacing groove 24, so that the first planarization layer 12 is etched, and a thickness of the first planarization layer 12 is thinned or even completely etched away. Generally, when the cathode layer 16 is manufactured, the cathode material falls into the first spacing groove 21 due to the process accuracy. If the first planarization layer 12 at the position of the first spacing groove 21 is thinned or etched away, and the cathode layer 16 may not be shielded by the first planarization layer 12, thereby short circuit between the etching barrier layer 13 and the conductive structure 11 may not be prevented.

In view of this, by disposing the etching barrier layer 13 on the side of the first planarization layer 12 away from the substrate 10 in the embodiments of the present application, and the orthographic projection of the etching barrier layer 13 on the substrate 10 at least covers an orthographic projection of the first spacing groove 21 on the substrate 10, so that the etching barrier layer 13 may prevent the etching liquid for etching the organic film layers above from contacting the first planarization layer 12 through the first spacing groove 21, thereby preventing the first planarization layer 12 from being etched, and further reducing the risk of short circuit between the cathode layer 16 and the conductive structure 11. In addition, the etching barrier layer 13 is located between the cathode layer 16 and the first planarization layer 12 and has a certain thickness like the first planarization layer 12, the etching barrier layer 13 may also play a role of shielding the cathode material which falls into the first spacing groove 21, thereby further reducing the risk of short circuit between the cathode layer 16 and the conductive structure 11.

Furthermore, the orthographic projection of the etching barrier layer 13 on the substrate 10 covers an orthographic projection of the first spacing groove 21 and the second spacing groove 24 on the substrate 10, so as to prevent part of the first planarization layer 12 at the position of the second spacing groove 24 from being thinned or etched away.

In the embodiments of the present application, a material of the etching barrier layer 13 is a non-organic material. Specifically, the material of the etching barrier layer 13 is a metal material. Furthermore, the material of the etching barrier layer 13 may be the same as the material of the conductive structure 11. Optionally, the material of the etching barrier layer 13 includes copper, molybdenum, or an alloy thereof. Furthermore, the planarization layer is an organic film layer, which may absorb water in an array cleaning process, so that the planarization layer contains a lot of water vapor, and the light-emitting layer and other films in the display area AA may be damaged by accumulation of the water vapor. For example, referring to FIG. 3 and FIG. 4, the etching barrier layer 13 in the present application is made of metal. If the first planarization layer 12 is shielded by the etching barrier layer 13, especially, the first planarization layer 12 located in the non-display area NAA is shielded by the etching barrier layer 13, the water vapor may not be released outward along a longitudinal direction of the display panel, but may merely diffuse laterally into the display area AA inside the first planarization layer 12, so that the light-emitting pixels located at an edge of the display area AA absorb water and shrink inward, thereby generating a border red line. Therefore, in the embodiments of the present application, referring to FIG. 3, FIG. 3 differs from FIG. 2 in that the etching barrier layer 13 is provided with a plurality of exhaust holes 131 in the first spacing groove 21, and the first planarization layer 14 is exposed by the plurality of exhaust holes 131.

It may be understood that, by opening holes in the etching barrier layer 13 in the present application, the water vapor inside the first planarization layer 12 may be released outside through the exhaust holes 131, so as to prevent the light-emitting layer and other films in the display area AA from being damaged by the accumulation of the water vapor, which is beneficial to improving display effects of the display panel. In addition, the exhaust holes 131 may further reduce an overlapping area of the cathode layer 16 and the conductive structure 11 in a top view, which is beneficial to further reducing the risk of short circuit therebetween.

Furthermore, Since the first planarization layer 12 is partially exposed by the exhaust holes 131, when the organic film layers are etched, the etching liquid may easily enter the surface of the first planarization layer 12 through the exhaust holes 131, so that the first planarization layer 12 is corroded, and the first planarization layer 12 is thinned or etched away, which is not unable to prevent the cathode material from contracting the conductive structure 11, resulting in short circuit between the cathode layer 16 and the conductive structure 11. Therefore, in the embodiments of the present application, a plurality of planarization blocks 141 corresponding to the plurality of exhaust holes 131 are disposed in the first spacing groove 21 and are disposed in a same layer as the second planarization layer 14. An orthographic projection of each of the plurality of planarization blocks 141 on the substrate 10 covers an orthographic projection of a corresponding one of the plurality of exhaust holes 131 on the substrate 10. That is, each of the plurality of planarization blocks 141 may cover the entire corresponding one of the plurality of exhaust holes 131, so that the exhaust holes 131 may be shielded, the surface of the first planarization layer 12 may be prevented from being exposed, and the etching liquid may not enter the surface of the first planarization layer 12 through the exhaust holes 131 to corrode to the first planarization layer 12, thereby playing a role in protecting the first planarization layer 12. In addition, the planarization blocks 141 in the embodiments of the present application may further play a role in blocking the organic encapsulation materials from flowing.

Figure 4:
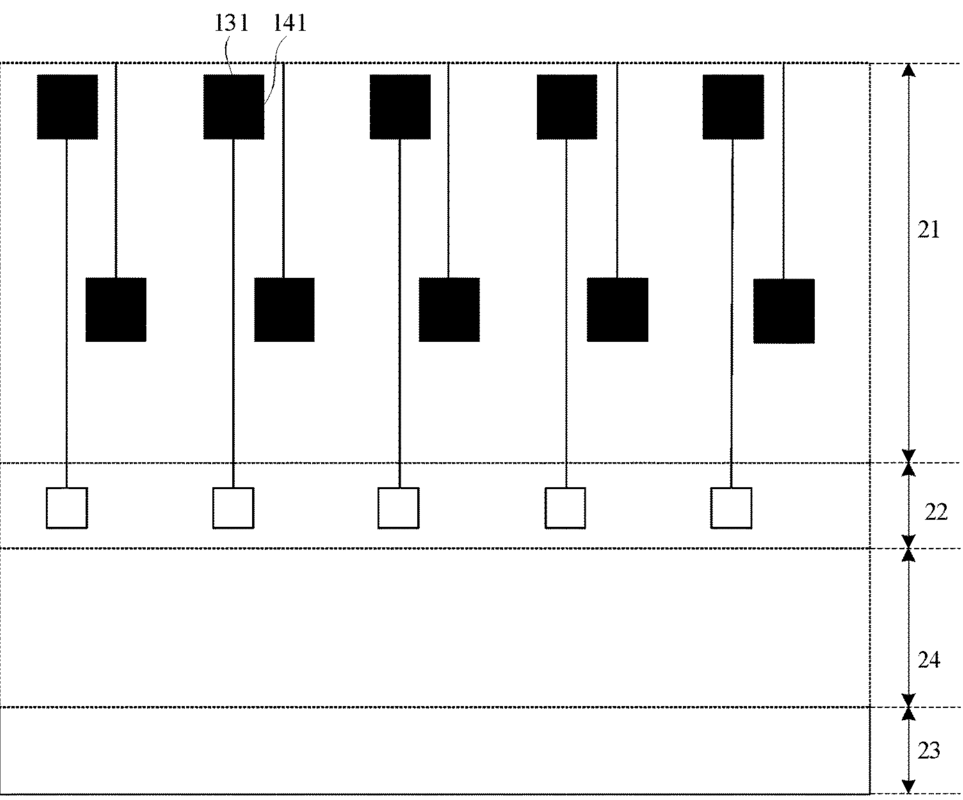
FIG. 4 is a top structural schematic diagram of a non-display area in FIG. 3.

Furthermore, referring to FIG. 4, the etching barrier layer 13 is further provided with the plurality of exhaust holes 131 at the second spacing groove 24. The second planarization layer 14 is exposed by the plurality of exhaust holes 131 to further release the water vapor inside the first planarization layer 12. It may be understood that first barrier dam 22 covers the plurality of exhaust holes 131 opened at the second spacing groove 24 the planarization block 141, the planarization blocks 141 do not need to be provided above the exhaust holes 131.

Specifically, an aperture of each of the plurality of exhaust hole 131 ranges from 12 microns to 18 microns, and a width of each of the plurality of planarization blocks 141 ranges from 12 microns to 18 microns. For example, in the present application, the aperture of each of the plurality of exhaust holes 131 is 12×12 microns, and the width of each of the plurality of the planarization blocks 41 is 18×18 microns.

Figure 3:
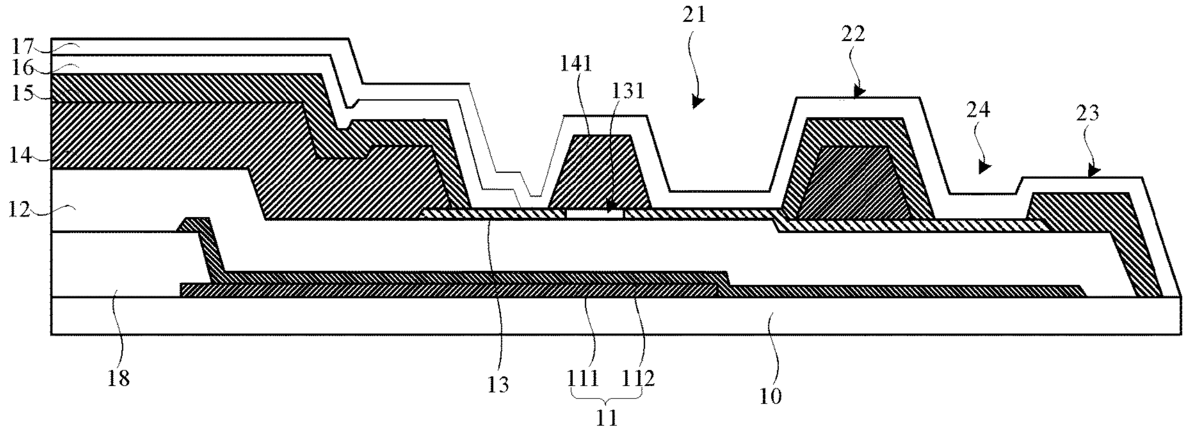
FIG. 3 is another cross-sectional structural schematic diagram of the display panel along the section line A-A in FIG. 1.

Optionally, a cross-sectional shape of each of the plurality of exhaust holes 131 may be any one of square, rectangular, circular, elliptical, or polygonal, which is not limited herein. For example, the cross-sectional shape of each of the plurality of exhaust holes 131 in the figure is square. Specifically, a cross-sectional shape of each of the plurality of planarization blocks 141 and the cross-sectional shape of each of the plurality of exhaust holes 131 may be same or different, as long as each of the plurality of planarization blocks 141 may fill a corresponding one of the plurality of exhaust holes 131 and covers an edge of the exhaust hole 131. Accordingly, the cross-sectional shape of each of the plurality of planarization blocks 141 may be any one of square, rectangle, circle, ellipse, and a polygon. For example, the cross-sectional shape of each of the plurality of the planarization blocks 141 in FIG. 3 is square.

Optionally, the plurality of planarization blocks 141 may be arranged in a plurality of rows and columns, and the planarization blocks 141 located in a same row/column are uniformly arranged, which is beneficial to improving an uniformity of water vapor release inside the first planarization layer 12 and ensuring that all of the water vapor is released. Specifically, the planarization blocks 141 located in adjacent rows/columns may be disposed directly or may be interleaved.

Specifically, the planarization blocks 141 are arranged in a same layer as the second planarization layer 14, and the planarization blocks 141 are formed in a same process as the first spacing groove 21 and the second spacing groove 24, which is beneficial to reducing the process and reduce the cost.

In other embodiments, the planarization blocks 141 may further be arranged in the same layer as the pixel definition Layer 15. Similarly, the planarization blocks 141 are formed in the same process as the first spacing groove 21 and the second spacing groove 24, which is beneficial to reducing the process and reduce the cost.

In an embodiment, when the first planarization layer 12, the second planarization layer 14, and the pixel definition layer 15 are etched with a same etching liquid, an etching rate of the first planarization layer 12 is less than an etching rate of the second planarization layer 14 and an etching rate of the pixel definition layer 15. By limiting the etching rate, an etching degree of the etching solution of the second planarization layer 14 and the pixel defining layer 15 on the first planarization layer 12 may be reduced to further reduce the risk of short circuit between the cathode layer 16 and the conductive structure 11.

In the embodiments of the present application, the display panel further includes an encapsulation layer 17 disposed on a side of the cathode layer 16 away from the substrate 10. The encapsulation layer 17 includes a first inorganic encapsulation layer, an organic encapsulation layer (not shown in the figures), and a second inorganic encapsulation layer (not shown in the figures) arranged and stacked in the thickness direction of the display panel and extending from the display area AA to the non-display area NAA. The first inorganic encapsulation layer contacts the etching barrier layer 13 in the first spacing groove 21 to prevent the first inorganic encapsulation layer from peeling. It should be noted that the touch layer is located on a side of the encapsulation layer 17 away from the substrate 10. Specifically, the touch layer is located on a side of the second inorganic encapsulation layer away from the substrate 10.

Optionally, the first inorganic encapsulation layer and the second inorganic encapsulation layer are formed by coating. A material of the organic encapsulation layer is made of flowable material, and the organic encapsulation layer is generally formed by inkjet printing. Therefore, a first spacing groove 21 is provided in the embodiments of the present application, so that there is a height difference between the organic film layers on both sides of the first spacing groove 21 and the first spacing groove 21, thereby preventing the organic encapsulation material from overflowing.

Specifically, a width of the first spacing groove 21 is greater than 100 microns. Generally, when the cathode layer 16 is manufactured, a shadow is formed by the cathode material in the non-display area NAA due to the process accuracy. That is, a distance between the boundary of the cathode layer 16 located in the non-display area NAA and the display area AA is generally less than 100 microns. Therefore, it is ensured that the boundary of the cathode layer 16 merely falls into the first spacing groove 21 and does not extend to a side of the first spacing groove 21 away from the display area.

Furthermore, in the embodiments of the present application, an orthographic projection of an edge of the etching barrier layer 13 away from the cathode layer 16 on the substrate 10 covers at least the orthographic projection of the first spacing groove 21 on the substrate 10. A reason for this arrangement is that an etching process is required during the formation of the etching barrier layer 13 and the second planarization layer 14. Since the etching barrier layer 13 is made of metal and the first planarization layer 12 and the second planarization layer 14 are both organic layers, the etching solution used in the etching process of the etching barrier layer 13 is different from the etching solution used in the etching process of the first planarization layer 12 and the second planarization layer 14, and the etching solution used in the etching process of the first planarization layer 12 and the second planarization layer 14 is a same type of etching solution. When the second planarization layer 14 is etched, a corrosion degree of the etching solution on the first planarization layer 12 is greater than a corrosion degree of the etching on the etching barrier layer 13, so as to prevent the first planarization layer 12 at the first spacing groove 21 from being corroded or slightly corroded, and the first planarization layer 12 at the first spacing groove 21 is prevented from being thinned and not playing the role of blocking the cathode layer 16 and the conductive structure 11. Therefore, in the embodiments of the present application, the etching barrier layer 13 is provided with an area as large as possible, at least over the whole of the first spacing groove 21.

Furthermore, the orthographic projection of the edge of the etching barrier layer 13 away from the cathode layer 16 on the substrate 10 is within an orthographic projection of the second barrier dam 23 on the substrate 10. A reason for this arrangement is that the non-display area NAA includes an effective encapsulation area on a side of the second barrier dam 23 away from the display area AA. Organic film layers in the effective encapsulation area is slotted to expose inorganic insulating layers below (for example, various inorganic interlayer insulating layers below the conductive structure 11), so that the first inorganic encapsulation layer of the encapsulation layer 17 is directly contact with an upper surface of the inorganic insulating layers exposed, a complete encapsulation closed loop of inorganic and inorganic is formed to protect the organic encapsulation layer therein. Therefore, If the etching barrier layer 13 extends to the effective encapsulation area, the etching barrier layer 13 is easy to contact with the conductive structure 11 extending to the outside of the second planarization area. Because the conductive structure 11 and the etching barrier layer 13 are connected with different electrical signals, the conductive structure 11 contacts the etching barrier layer 13, resulting in signal disorder and affecting the yield.

In the embodiments of the present application, the conductive structure 11 includes a VDD signal line for transmitting a high-level voltage signal. The cathode layer 16 contacts the etching barrier layer 13 in the first spacing groove 21 to electrically connect with a low-level power supply signal line (VSS) for transmitting a low-level voltage signal.

In the embodiments of the present application, the conductive structure 11 may be a double-layer or multi-layer structure to reduce an impedance of the conductive structure 11. For example, in FIG. 2 and FIG. 3, the conductive structure 11 includes a first conductive layer 111 and a second conductive layer 112 arranged and stacked in a thickness direction of the display panel. The first conductive layer 111 and the second conductive layer 112 are electrically connected, and the first conductive layer 111 and the source electrode and the drain electrode of the thin film transistor are arranged in the same layer.

Furthermore, the display panel further includes a third planarization layer 18 located in the display area AA and covers at least part of a side of the first conductive layer 111 and part of a side of the substrate 10 located in the display area, and at least part of the second conductive layer 112 located in the display area is located on a side of the third planarization layer 18 away from the substrate 10. A part of the third planarization layer 18 in the non-display area NAA is etched away.

In the embodiments of the present application, the display panel may adopt a fanout in the display area (FIAA) technology, which may effectively reduce the lower border of the panel. In the FIAA technology, a design of multi-layer connection wring is introduced to squeeze out wring space for fanout wrings. Specifically, the display area AA includes a normal display area and a fan-out display area, and the fan-out display area is located between the normal display area and the non-display area NAA.

The embodiment of the present application further provides a display device including a display panel in the embodiments mentioned above. The display device may be a computer, a television, a vehicle-mounted display device, and other display devices with display functions, which are not specifically limited in this present application. The display device provided by the embodiments of the present application has beneficial effects of the display panel provided by the embodiments of the present application. For details, please refer to the specific description of the display panel in the embodiments mentioned above, and this embodiment will not be repeated here.

Beneficial effects are that: the embodiments of the present application provide the display panel and the display device. A first planarization layer covering the conductive structure extends from the display area to the non-display area. When the cathode layer is manufactured, even if the cathode material falls into the first spacing groove due to the process precision, since the first planarization layer may shield the cathode material, so that short circuit may be prevented after the cathode contacts the conductive structure in the non-display area, which is beneficial to improving the yield of the display panel. Meanwhile, compared with the prior art, the passivation layer between the cathode layer and the conductive structure does not need to be manufactured, which is beneficial to saving the manufacturing process and reducing the cost.

In summary, although the present application has been disclosed in the above preferred embodiments, the above preferred embodiments do not intend to limit the present application. Various modifications and changes may be made by ordinary person skilled in the art without departing from the spirit and scope of this disclosure. Therefore, the scope of protection of this application is subject to the scope defined by the claims.

What is claimed is:

1. A display panel, comprising a display area and a non-display area located on at least one side of the display area, and further comprising:

a substrate;

a conductive structure, located on a side of the substrate and extending from the display area to the non-display area;

a first planarization layer, covering the conductive structure and extending from the display area to the non-display area;

a second planarization layer, located on a side of the first planarization layer away from the substrate and located in the display area and the non-display area;

a pixel definition layer, located on a side of the second planarization layer away from the substrate and located in the display area and the non-display area;

a cathode layer, located on a side of the pixel definition layer away from the substrate;

a first spacing groove, located in the non-display area and penetrating through the second planarization layer and the pixel definition layer, wherein a boundary of the cathode layer falls into the first spacing groove; and an etching barrier layer, located on the side of the first planarization layer away from the substrate and located in the non-display area;

wherein the etching barrier layer is provided with a plurality of exhaust holes in the first spacing groove, a plurality of planarization blocks are disposed in the first spacing groove, and each of the plurality of planarization blocks is corresponding to one of the plurality of exhaust holes.

2. The display panel according to claim 1, further comprising a first barrier dam and a second barrier dam located in the non-display area at intervals, wherein the second barrier dam is located on a side of the first barrier dam away from the first spacing groove, and a second spacing groove is defined between the first barrier dam and the second barrier dam;

wherein the first barrier dam comprises the second planarization layer and the pixel definition layer, and the second barrier dam comprises the pixel definition layer and does not comprise the second planarization layer.

3. The display panel according to claim 1, wherein the conductive structure comprises a first conductive layer and a second conductive layer arranged and stacked in a thickness direction of the display panel;

wherein the display panel further comprises a third planarization layer located in the display area and covering at least a side of a part of the first conductive layer and a side of a part of the substrate located in the display area, and a part of the second conductive layer located in the display area is located on a side of the third planarization layer away from the substrate.

4. The display panel according to claim 1, wherein when the first planarization layer, the second planarization layer, and the pixel definition layer are etched with a same etching liquid, an etching rate of the first planarization layer is less than an etching rate of the second planarization layer and an etching rate of the pixel definition layer.

5. The display panel according to claim 2, wherein an orthographic projection of the etching barrier layer on the substrate at least covers an orthographic projection of the first spacing groove on the substrate.

6. The display panel according to claim 5, wherein an orthographic projection of a boundary of the etching barrier layer away from the display area on the substrate is within an orthographic projection of the second barrier dam on the substrate.

7. The display panel according to claim 5, wherein the etching barrier layer is made of metal.

8. The display panel according to claim 5, wherein the cathode layer contacts the etching barrier layer in the first spacing groove.

9. The display panel according to claim 5, further comprising an encapsulation layer disposed on a side of the cathode layer away from the substrate, wherein the encapsulation layer comprises a first inorganic encapsulation layer, an organic encapsulation layer, and a second inorganic encapsulation layer arranged and stacked in a thickness direction of the display panel and extending from the display area to the non-display area;

wherein the first inorganic encapsulation layer contacts the etching barrier layer in the first spacing groove.

10. The display panel according to claim 7, wherein the first planarization layer is exposed by the plurality of exhaust holes.

11. The display panel according to claim 10, wherein the plurality of planarization blocks are disposed in a same layer as the second planarization layer, and an orthographic projection of each of the plurality of planarization blocks on the substrate covers an orthographic projection of a corresponding one of the plurality of exhaust holes on the substrate.

12. The display panel according to claim 11, wherein an aperture of each of the plurality of exhaust holes ranges from 12 microns to 18 microns, and a width of each of the plurality of planarization blocks ranges from 12 microns to 18 microns.

13. A display device, comprising a display panel comprising a display area and a non-display area located on at least one side of the display area, wherein the display panel comprises:

a substrate;

a conductive structure, located on a side of the substrate and extending from the display area to the non-display area;

a first planarization layer, covering the conductive structure and extending from the display area to the non-display area;

a second planarization layer, located on a side of the first planarization layer away from the substrate and located in the display area and the non-display area;

a pixel definition layer, located on a side of the second planarization layer away from the substrate and located in the display area and the non-display area;

a cathode layer, located on a side of the pixel definition layer away from the substrate; and a first spacing groove, located in the non-display area and penetrating through the second planarization layer and the pixel definition layer, wherein a boundary of the cathode layer falls into the first spacing groove; and an etching barrier layer, located on the side of the first planarization layer away from the substrate and located in the non-display area;

wherein the etching barrier layer is provided with a plurality of exhaust holes in the first spacing groove, a plurality of planarization blocks are disposed in the first spacing groove, and each of the plurality of planarization blocks is corresponding to one of the plurality of exhaust holes.

14. The display device according to claim 13, wherein the display panel further comprises a first barrier dam and a second barrier dam located in the non-display area at intervals, the second barrier dam is located on a side of the first barrier dam away from the first spacing groove, and a second spacing groove is defined between the first barrier dam and the second barrier dam;

wherein the first barrier dam comprises the second planarization layer and the pixel definition layer, and the second barrier dam comprises the pixel definition layer and does not comprise the second planarization layer.

15. The display device according to claim 13, wherein the conductive structure comprises a first conductive layer and a second conductive layer arranged and stacked in a thickness direction of the display panel;

wherein the display panel further comprises a third planarization layer located in the display area and covering at least part of a side of the first conductive layer and part of a side of the substrate located in the display area, and a part of the second conductive layer located in the display area is located on a side of the third planarization layer away from the substrate.

16. The display device according to claim 14, wherein an orthographic projection of the etching barrier layer on the substrate at least covers an orthographic projection of the first spacing groove on the substrate.

17. The display device according to claim 16, wherein an orthographic projection of a boundary of the etching barrier layer away from the display area on the substrate is within an orthographic projection of the second barrier dam on the substrate.

18. The display device according to claim 16, wherein the etching barrier layer is made of metal.

19. The display device according to claim 18, wherein the first planarization layer is exposed by the plurality of exhaust holes.

20. The display device according to claim 19, wherein the plurality of planarization blocks are disposed in a same layer as the second planarization layer, and an orthographic projection of each of the plurality of planarization blocks on the substrate covers an orthographic projection of a corresponding one of the plurality of exhaust holes on the substrate.

* * * * *